(12) United States Patent
Coe

(10) Patent No.: US 7,355,204 B2
(45) Date of Patent: Apr. 8, 2008

(54) ORGANIC DEVICE WITH ENVIRONMENTAL PROTECTION STRUCTURE

(75) Inventor: Nigel Morton Coe, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/026,263

(22) Filed: Dec. 30, 2004

(65) Prior Publication Data
US 2006/0145596 A1  Jul. 6, 2006

(51) Int. Cl.
*H01L 31/0224* (2006.01)
(52) U.S. Cl. .............. 257/72; 257/40; 257/E51.022; 257/E51.02; 313/491; 313/493; 313/500; 313/505; 313/512
(58) Field of Classification Search .............. 257/72
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,302,468 A | 4/1994 | Namiki et al. | |
| 5,408,109 A | 4/1995 | Heeger et al. | |
| 5,814,935 A * | 9/1998 | Ujihara | 313/504 |
| 6,140,766 A * | 10/2000 | Okada et al. | 313/506 |
| 7,002,292 B2 * | 2/2006 | Prakash | 313/504 |
| 7,011,562 B2 * | 3/2006 | Kim et al. | 445/25 |
| 7,034,452 B2 * | 4/2006 | Kim | 313/500 |
| 2003/0034497 A1 * | 2/2003 | Yamazaki et al. | 257/86 |
| 2003/0205763 A1 * | 11/2003 | Park et al. | 257/359 |
| 2004/0170927 A1 | 9/2004 | Pichler | |
| 2006/0119263 A1 * | 6/2006 | Chen et al. | 313/512 |

* cited by examiner

*Primary Examiner*—Sue A. Purvis
*Assistant Examiner*—Eduardo A. Rodela
(74) *Attorney, Agent, or Firm*—John H. Lamming

(57) ABSTRACT

An organic electronic device includes a first member including: a substrate; a first conductive layer formed on the substrate; an organic active layer deposited on a portion of the first conductive layer; and a second conductive layer deposited on the organic active layer and on the first conductive layer; and a second member coupled to the first member to form an enclosed space, the second member including: a lid; and a third conductive layer deposited on the lid, wherein the third conductive layer is electrically coupled to one or both of the first and the second conductive layers.

18 Claims, 7 Drawing Sheets

ORGANIC DEVICE WITH ENVIRONMENTAL PROTECTION STRUCTURE

FIELD OF THE INVENTION

This invention relates generally to electronic devices and particularly to organic electronic devices.

BACKGROUND INFORMATION

Organic electronic devices are used in various applications today. One of the applications that benefit from organic materials is the display application. Displays made with organic materials are useful for battery-powered, portable electronic devices (e.g., cell phones, personal digital assistants, handheld personal computers, and DVD players) and also for desktop or wall-mounted television screens and computer monitors. The displays for these applications may require high information content, full color (FC), fast video rate response, low power consumption, in addition to use in smaller size devices.

Electronic devices, such as an organic light emitting diode (OLED), which typically includes a layered structure formed on a substrate and an encapsulation cap that encloses the layers, may be used in the above displays. The multi-layered structure contains a layer with a driver circuit, including layers with electrical components (e.g., electrodes) and at least one layer that contains an organic active material. As the layers may be sensitive to environmental elements such as moisture, dust, and oxygen, an encapsulation cap may be used to enclose and protect the layers from these elements.

Various lid designs and sealing techniques have been experimented with to encapsulate the layers of the device. One of the limitations is that both anode output leads and cathode output leads are required in order to terminate on one side of the display, and in order to use a single connector to form electrical connections with the peripheral drive circuitry. In a device where the anodes are formed before the cathodes, the cathode output leads are typically routed around the periphery of the display array to the side of the substrate where the anode leads are formed (or vice versa when the cathodes are formed before the anodes). The routed leads take up a large area on the substrate and undesirably increase the overall display panel size. In addition to the increase in size, the routing of the leads results in other undesirable effects such as an increased resistance in the longer leads and a greater resistance difference between leads as a result of their different lengths. The increase in resistance is exacerbated by the fact that some leads are routed through areas that receive laser ablation and can be damaged during the laser ablation process.

There remains a need for an organic electronic device that has an environmental protection structure that allows for the termination of the anode output leads and the cathode output leads on the same side of the device.

SUMMARY OF THE INVENTION

In one embodiment, an organic electronic device includes a first member including: a substrate; a first conductive layer formed on the substrate; an organic active layer deposited on a portion of the first conductive layer; and a second conductive layer deposited on the organic active layer and on the first conductive layer; and a second member coupled to the first member to form an enclosed space, the second member including: a lid; and a third conductive layer deposited on the lid, wherein the third conductive layer is electrically coupled to one or both of the first and the second conductive layers.

In another embodiment, an organic electronic device includes a substrate having a first conductive layer, an organic active layer, and a second conductive layer formed thereon; a nonconductive lid for coupling to the substrate to form an enclosure, the lid including a third conductive layer on a surface of the lid; wherein the second conductive layer is electrically coupled to the first conductive layer and the first conductive layer is electrically coupled to the third conductive layer.

In another embodiment, an organic electronic device is made by providing a first member with a first conductive layer; depositing an organic active layer and a second conductive layer on the first conductive layer; selectively removing the organic active layer to expose portions of the first conductive layer, wherein the exposed portions of the first conductive layer are electrically coupled to the second conductive layer; preparing a second member by depositing a third conductive layer on a lid; coupling the second member to the first member with a conductive sealant such that the first member and the second member enclose the organic active layer and the second conductive layer, and the third conductive layer is electrically coupled to at least the first conductive layer.

In another embodiment, a method of making an organic electronic device includes providing a substrate; forming a first conductive layer on the substrate; depositing an organic active layer on a portion of the first conductive layer; depositing a second conductive layer on the organic active layer and the first conductive layer; combining the substrate with a environmental protection structure using a conductive sealant, wherein the environmental protection structure has a third conductive layer that is electrically coupled to at least one of the first and the second conductive layers.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
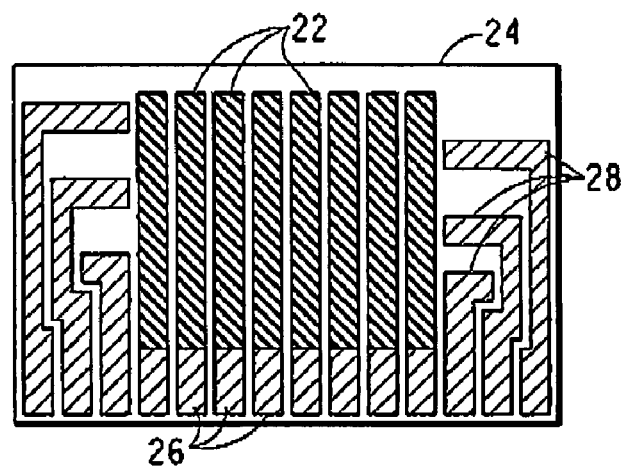
FIG. 1 is a plan view of a conventional unencapsulated organic electronic device.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any combination. Further, reference to values stated in ranges includes each and every value within that range. It is to be understood that the elements in the figures are not necessarily drawn to scale. For example, the dimensions of some of the elements in the figures may be exaggerated relative to other elements to assist in an understanding of the embodiments of the invention.

Other features and advantages of the invention will be apparent from the following detailed description and from the claims.

DETAILED DESCRIPTION

In one embodiment, an organic electronic device includes a first member including: a substrate; a first conductive layer formed on the substrate; an organic active layer deposited on a portion of the first conductive layer; and a second conductive layer deposited on the organic active layer and on the first conductive layer; and a second member coupled to the first member to form an enclosed space, the second member including: a lid; and a third conductive layer deposited on the lid, wherein the third conductive layer is electrically coupled to one or both of the first and the second conductive layers. The first conductive layer may include first electrodes that are formed on a surface of the substrate; and leads that are electrically isolated from the first electrodes and formed on the substrate. The first conductive layer extends to one or more edges of the substrate. The leads extend to one or more edges of the substrate. The third conductive layer includes a first set of traces; and a second set of traces that are electrically isolated from the first set of traces. The first electrodes are electrically coupled to the first set of traces and the leads are electrically coupled to the second set of traces. The second conductive layer includes second electrodes that are electrically coupled to the leads through vias in the organic active layer. The first set of traces and second set of traces extend to an edge of the lid. The device further includes an electrically conductive sealant material located between the second member and the first member for electrically coupling the first conductive layer to the third conductive layer. The electrically conductive sealant includes beads of electrically conductive material mixed with epoxy, and the sealant couples the lid to the substrate to form an enclosed space.

In another embodiment, an organic electronic device includes a substrate having a first conductive layer, an organic active layer, and a second conductive layer formed thereon; a nonconductive lid for coupling to the substrate to form an enclosure, the lid including a third conductive layer on a surface of the lid; wherein the second conductive layer is electrically coupled to the first conductive layer and the first conductive layer is electrically coupled to the third conductive layer. The substrate is coupled to the lid with an electrically conductive sealant, wherein the sealant electrically couples the first conductive layer to the third conductive layer. The first conductive layer includes leads and electrodes that are electrically isolated from each other, and wherein the second conductive layer is electrically coupled to the leads through vias in the organic active layer.

In another embodiment, an organic electronic device is made by providing a first member with a first conductive layer; depositing an organic active layer and a second conductive layer on the first conductive layer; selectively removing the organic active layer to expose portions of the first conductive layer, wherein the exposed portions of the first conductive layer are electrically coupled to the second conductive layer; preparing a second member by depositing a third conductive layer on a lid; coupling the second member to the first member with a conductive sealant such that the first member and the second member enclose the organic active layer and the second conductive layer, and the third conductive layer is electrically coupled to at least the first conductive layer. The first conductive layer includes electrodes and leads, and wherein at least one or more of the electrodes and the leads extend to an edge of the first member. The third conductive layer includes a first set of traces and a second set of traces that are electrically isolated from each other. The electrodes in the first conductive layer are electrically coupled to the first set of traces in the third conductive layer. The device further includes a getter material that is enclosed by the first member and the second member.

In another embodiment, a method of making an organic electronic device includes providing a substrate; forming a first conductive layer on the substrate; depositing an organic active layer on a portion of the first conductive layer; depositing a second conductive layer on the organic active layer and the first conductive layer; combining the substrate with a environmental protection structure using a conductive sealant, wherein the environmental protection structure has a third conductive layer that is electrically coupled to at least one of the first and the second conductive layers.

Definitions

Before addressing details of embodiments described below, some terms are defined herein.

As used herein, the term "active" when referring to a layer or material is intended to mean a layer or material that exhibits electro-radiative properties. An active layer material may emit radiation or exhibit a change in concentration of electron-hole pairs when receiving radiation.

The term "charge transport" when referring to a layer, material, member, or structure is intended to mean such layer, material, member, or structure facilitates migration of such charge through the thickness of such layer, material, member, or structure with relative efficiency and small loss of charge.

The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

As used herein, the terms "comprises," "comprising," "includes," "including," "has," "having" or any other variation thereof, are intended to cover a non-exclusive inclusion.

For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

As used herein, a layer of material being "on" a surface includes both the case where the layer is adjacent to the surface and the case where there are intervening layers between the layer and the surface.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct connection between electronic component(s), circuit(s) or electronic component(s) or circuit(s) with switch(es) (e.g., transistor(s)) connected between them.

The term "over-hanging projection" is intended to mean a portion of a structure overlying a substrate, wherein that portion, as seen from a cross-sectional view along a line substantially perpendicular to a primary surface of a substrate, extends over and is spaced apart from another portion of the same structure. Such spaced-apart portions of the structure may be part of the same or different layers.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "substrate" is intended to mean a base material that can be either rigid or flexible and may be include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

The term "environmental protection structure" is intended to mean a structure that substantially protects a portion of an electronic device from damage originating from a source external to the electronic device. An example of an environmental protection structure includes a substrate, a lid attached to the substrate, or a combination thereof. As used herein, the lid is an environmental protection structure designed to be combined with the substrate to form an enclosed space. Other elements (e.g., a sealant) may also be used to form the enclosed space.

A "conductive layer," a "trace," a "lead," an "electrode," and its variants are intended to mean a layer material, member, or structure having an electrical property such that current flows through such layer material, member, or structure without a substantial drop in potential. With respect to the particular invention, an "electrode" is encapsulated by the lid or shares the same boundaries as the lid in the end device while a "lead" may be exposed even after the lid is mated with the substrate.

A "via," as used herein, is a cutout in a layer of material.

Organic Electronic Device and Method

The invention is an organic electronic device that outputs the anode leads and cathode leads on one side of the device without an increase in device size, and a method for making such device. In a conventional device, the conductive traces are formed on the substrate surface that supports the electrodes. Thus, the substrate needs to be large enough to accommodate the conductive traces in addition to the electrodes. In the inventive device, the undesirable size increase is avoided by moving the conductive traces to the lid and electrically coupling the lid to the electrodes with a conductive sealant, effectively "folding" the large substrate of the conventional device to achieve a more compact device by using the lid to decrease the overall size of the display device.

In one embodiment of the invention, the organic electronic device includes an organic light emitting diode (OLED), which generally has the following layers: anode/ charge transport layer/organic active layer/cathode. The anode is typically a material, such as, for example, indium/ tin oxide (ITO), that has the ability to inject holes into the otherwise filled π-band of the semiconducting organic material. The anode is optionally supported on a glass or plastic substrate. In this embodiment, the charge transport layer is a hole transport layer, such as polyaniline (PANI), poly(3, 4-ethylenedioxythiophene) (PEDOT), or an organic charge transfer compound, such as tetrathiafulvalene tetracyanoquinodimethane (TTF-TCQN). The organic material for the organic active layer may contain nearly any organic electroluminescent or other organic radiation-emitting materials. Such materials can be small molecule materials or polymeric materials. Small molecule materials may include those described in, for example, U.S. Pat. Nos. 4,356,429 and 4,539,507. Alternatively, polymeric materials may include those described in U.S. Pat. Nos. 5,247,190, 5,408,109, and 5,317,169. Exemplary materials are semiconducting conjugated polymers. The cathode is typically any material, such as Ca or Ba, that has the ability to inject electrons into the otherwise empty π-band of the organic active layer.

Figure 2:
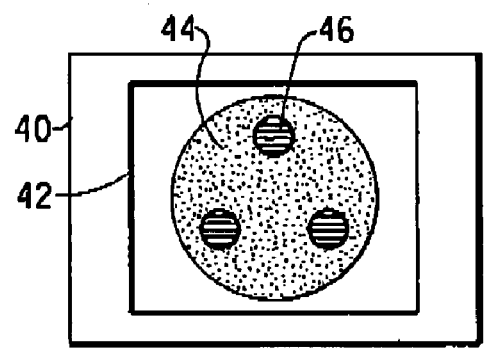
FIG. 2 is a plan view of a conventional encapsulation lid.
Figure 3:
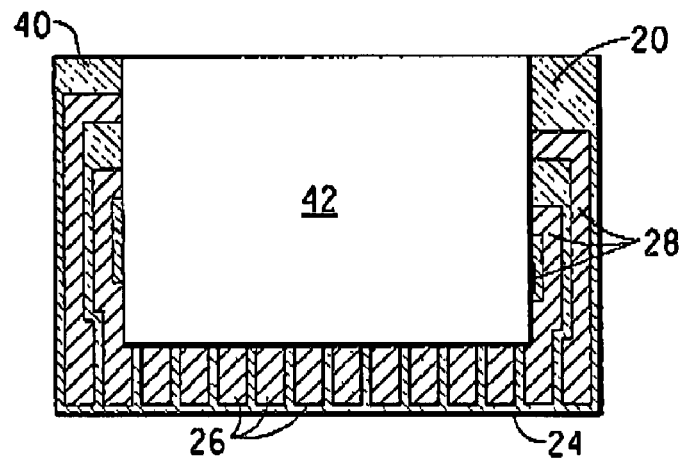
FIG. 3 is a plan view of a conventional encapsulated organic electronic device.
Figure 4:
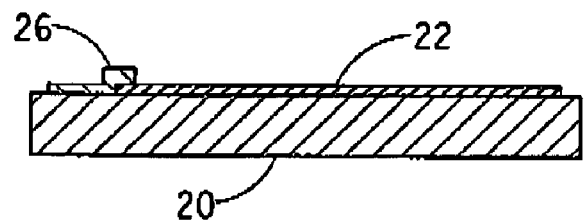
FIG. 4 is a side view of the conventional unencapsulated organic electronic device of FIG. 1.
Figure 5:
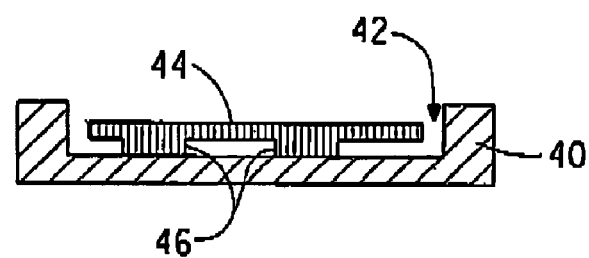
FIG. 5 is a side view of the lid of FIG. 2.
Figure 6:
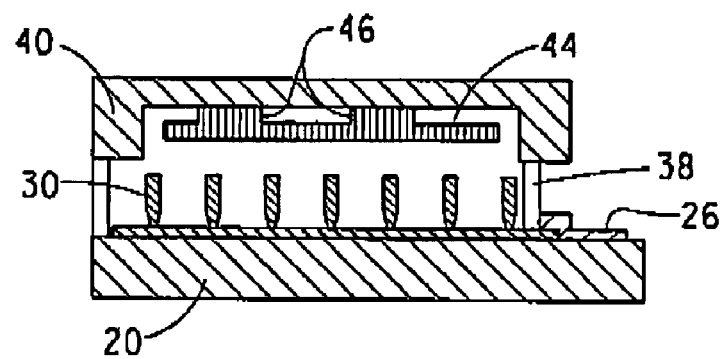
FIG. 6 is a side view of a conventional encapsulated organic electronic device.

FIGS. 1, 2, and 3 are plan views of a conventional method for building an organic electronic device. FIGS. 4, 5, and 6 are the side views corresponding to FIGS. 1, 2, and 3.

FIG. 1 is a plan view of a substrate 20 with first electrodes 22 formed thereon, and FIG. 4 is a side view of the substrate 20 in FIG. 1. The substrate 20 may be a glass or plastic plate, and has edges 24. The first electrodes 22 (anodes) are deposited on the substrate 20 and patterned into "bars." The first electrodes 22 are formed so that there is a sufficient unused area between the first electrodes 22 and the edges 24 of the substrate 20.

First leads 26 are formed in an area between the first electrodes 22 and the edges 24. The first leads 26 extend in the same direction as the first electrodes 22 as extensions of the first electrodes 22. Each of the first leads 26 are electrically isolated from the other first leads 26 and electrically coupled to one of the first electrodes 22. In two of the remaining areas between the first electrodes 22 and the edges 24 are formed second leads 28. The second leads 28 are electrically isolated from the first electrodes 22, and are electrically isolated from one another. In FIG. 4, which is a side view of the device of FIG. 1, the first leads 26 partially overlap the first electrodes 22, and the surface of the substrate 20 is illustrated as not substantially planar.

A layer of organic material and a charge transport material are deposited on the first electrode 22 to form an organic active layer. A set of second electrodes is then deposited on the organic active layer. The second electrodes are deposited primarily over an area of the organic active layer that overlies the first electrodes 22, and form "stripes" that extend in a direction that is substantially perpendicular to the direction of the first electrodes 22.

FIG. 2 and FIG. 5 are a plan view and a side view, respectively, of a lid 40 that is designed to be mated with the substrate 20. The lid 40 is prepared by forming a cavity 42 therein. The lid 40 is sized so that when it is mated with the substrate 20, substantially all of the first electrodes 22 will be positioned in the cavity 42, while the first leads 26 remain uncovered by the lid 40.

A getter tablet 44 is securely attached to a surface of the cavity 42 with epoxy dots 46. The getter tablet 44 is a material that is used to absorb any moisture that seeps into the device. No electrically conductive component (e.g., a lead, a trace, or an electrode) is present in the lid 40. The function of lid 40 is to shield the layers of the organic electronic device from environmental elements.

FIG. 3 and FIG. 6 are a plan view and a side view, respectively, of the lid 40 combined with the structure of FIG. 1F. The first electrodes 22 and the layers deposited thereon are encapsulated by the lid 40 while the first leads 26 and the second leads 28 extend beyond the periphery of the lid 40. In some embodiments, nitrogen may be injected into the space enclosed by the lid 40.

The substrate 20 of the device shown in FIG. 3 and FIG. 6 has to provide enough surface area to accommodate not only the layered structures but also the first leads 26 and the second leads 28. The invention achieves a more compact device by changing the configuration of the leads. More specifically, instead of extending the leads along the edges of the substrate, the leads are positioned on the surface of the lid that is enclosed when the lid and the substrate are combined. The leads on the lid are herein referred to as "traces". The traces are electrically coupled to the leads that are on the substrate through a conductive sealant material that is used for coupling the lid to the substrate.

Figure 12:
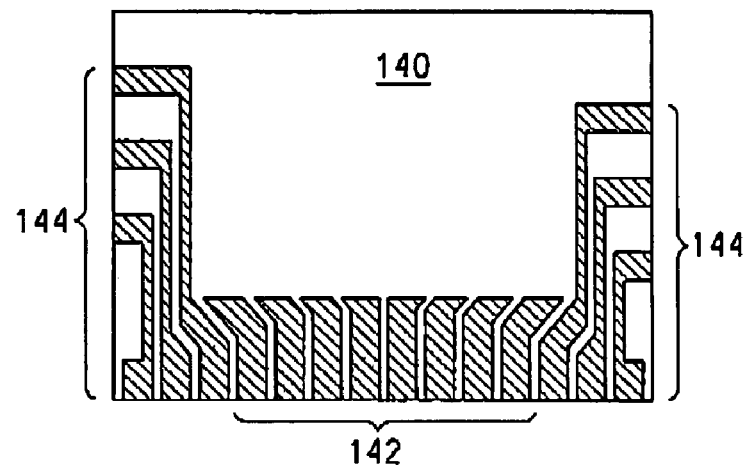
FIGS. 12 and 13 are plan views of an embodiment of a lid with traces.
Figure 13:
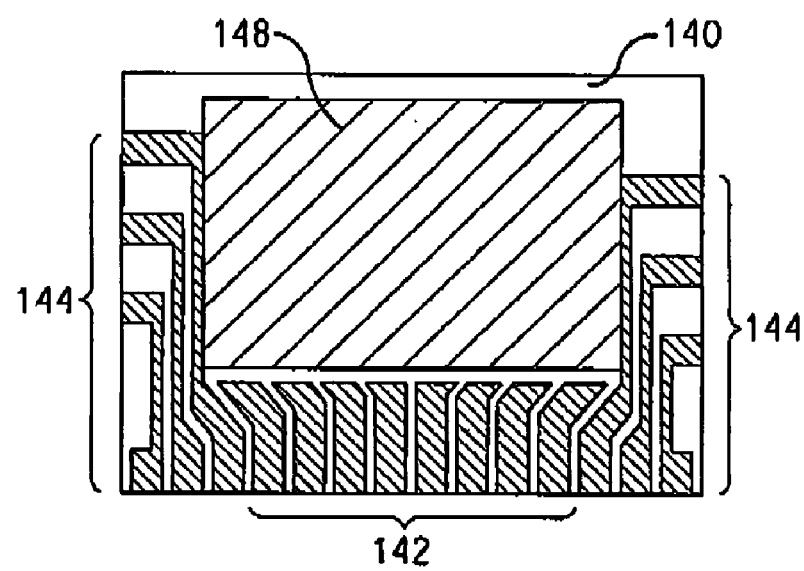
Figure 14:
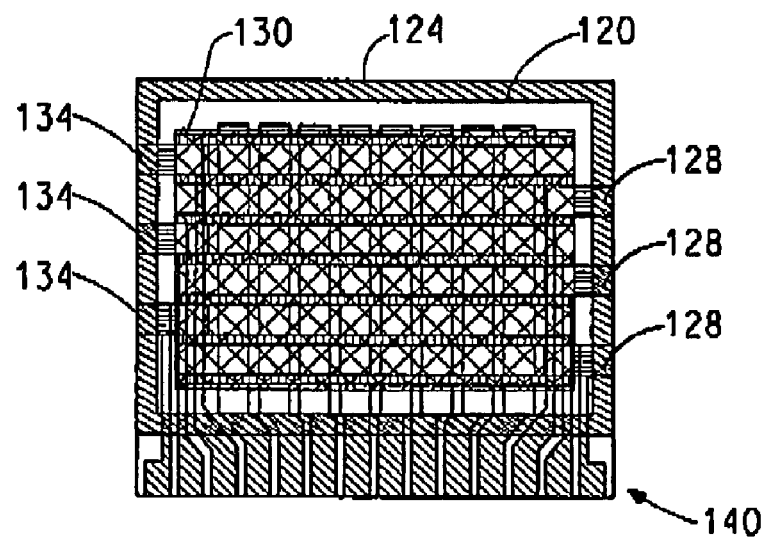
FIG. 14 is a plan view of an embodiment of an encapsulated organic electronic device.
Figure 20:
FIGS. 20 and 21 are side views of an embodiment of a lid with traces.
Figure 21:
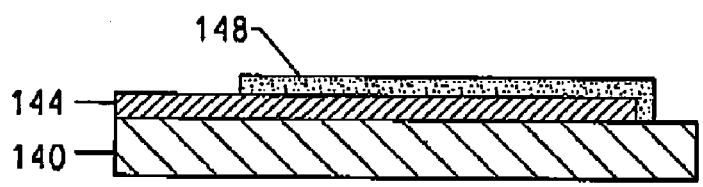
Figure 22:
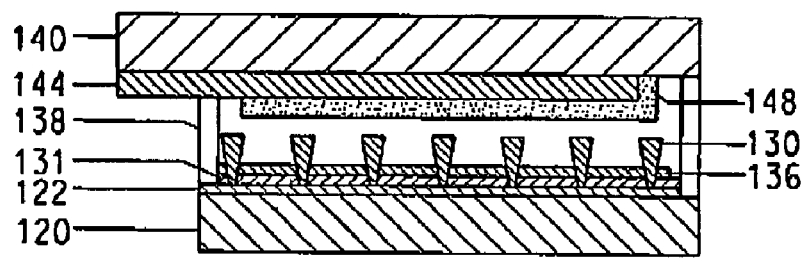
FIG. 22 is a side view of an embodiment of an encapsulated organic electronic device.

FIGS. 7-11 are plan views illustrating the substrate-building process of the invention, and FIGS. 15-19 are side views of the stages shown in FIGS. 7-11, respectively. FIGS. 12 and 13 are plan views of the lid-building process of the invention, and FIGS. 20 and 21 are the corresponding side views, respectively. FIG. 14 and FIG. 22 show a plan view and a side view of an embodiment of the device made by combining the substrate and the lid.

Figure 7:
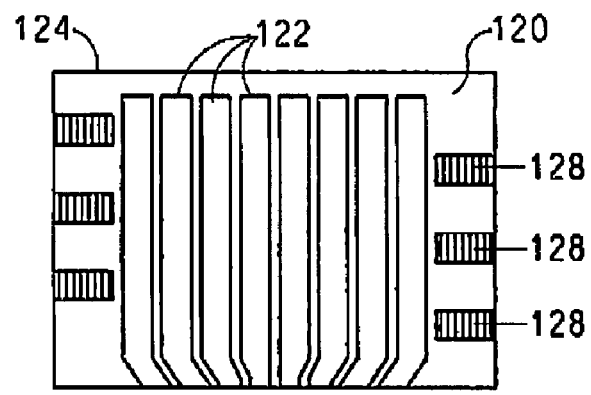
FIGS. 7-11 are plan views of an embodiment of an unencapsulated organic electronic device.
Figure 15:
FIGS. 15-19 are side views of an embodiment of an unencapsulated organic electronic device.

As shown in FIG. 7, a first conductive layer is deposited on a substrate 120 and patterned into first electrodes 122. The substrate 120, which may be made of glass, has edges 124. The dimensions of the substrate 120, as seen in the plan view, are smaller than the dimensions of the substrate 20 used for the conventional device. The first electrodes 122 are bar-shaped and are electrically isolated from one another, similar to the first electrodes 22 of FIG. 1. However, unlike the first electrodes 22 of FIG. 1, which were formed only near the center of the substrate 20 and did not extend to any of the edges 24, the first electrodes 122 extend to one of the edges 124. Also formed on the substrate 122 are a set of leads 128. The leads 128 are formed in an area near the edges 124, and are electrically isolated from the first electrodes 122. The leads 128 extend all the way to the edges 124. FIG. 15 is a side view of what is shown in FIG. 7.

Figure 8:
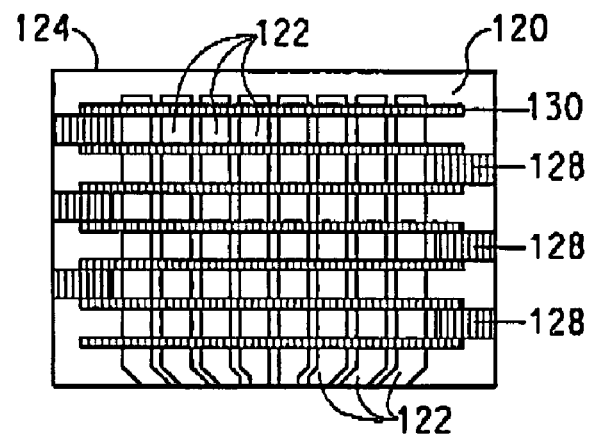
Figure 16:
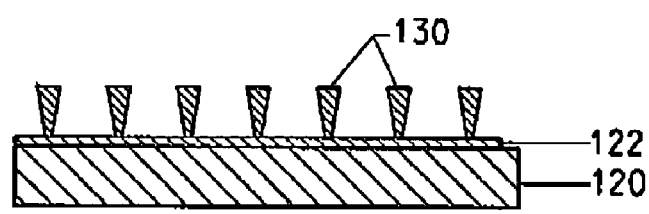

FIG. 8 is a plan view illustrating the separators 130 formed on the first electrodes 122. The separators 130, which are made of a nonconductive material such as photoresist, extend in a direction that is substantially perpendicular to the direction in which the first electrodes 122 extend. The separators 130 are spaced apart such that the space between two neighboring separators 130 is approximately equal to the width of one of the leads 128, and one of the leads 128 fits into each of the spaces between neighboring separators 130. FIG. 16, which is a side view of the substrate 120, illustrates a tapered shaped of the separators.

Figure 9:
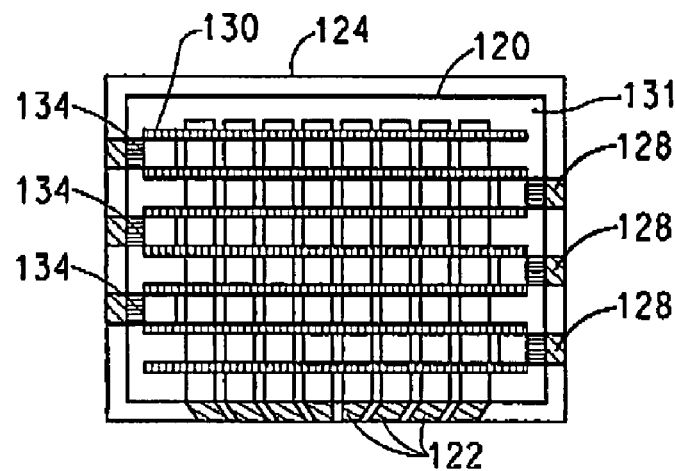

FIG. 9 is a plan view illustrating the deposition of an organic material and optionally a charge transport material to form an organic active layer 131. In one embodiment of the organic electronic device 100, the charge transport material is a conductive polymer and facilitates the injection of holes from the anode into the EL polymer layer. The charge transport layer is sometimes called a hole-injection layer, a hole transport layer, or may be characterized as part of a bilayer anode.

Figure 17:
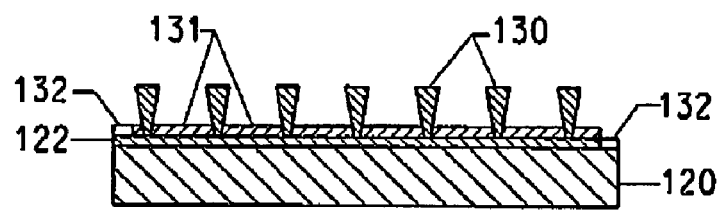

The deposition of the organic material is followed by laser ablation. Laser ablation may be used to remove the charge transport material and the organic material to form a border 132 for a sealant (FIG. 17). The dimensions of the border 132 may be substantially the same as the dimensions of the cavity 42 in FIG. 2. The outer dimensions of the substrate 120 are substantially the same as the outer dimensions of the border 132 and thus, the border 132 extends along the edges 124 of the substrate 120. The organic active layer 131 is removed from the sealant area because the presence of certain organic materials allow moisture to seep into the device, causing degradation of device performance. By clearing the border 132 of the organic material and any charge transport material, a seal protecting the device from environmental factors can be achieved.

Laser ablation is also used to form vias 134 on the leads 128. The vias 134 are substantially free of the charge transport materials and the organic material of the organic active layer 131. FIG. 17, which is a side view of the substrate 120, shows the organic active layer 131 and the absence of the charge transport material and the organic material in the border 132.

Figure 10:
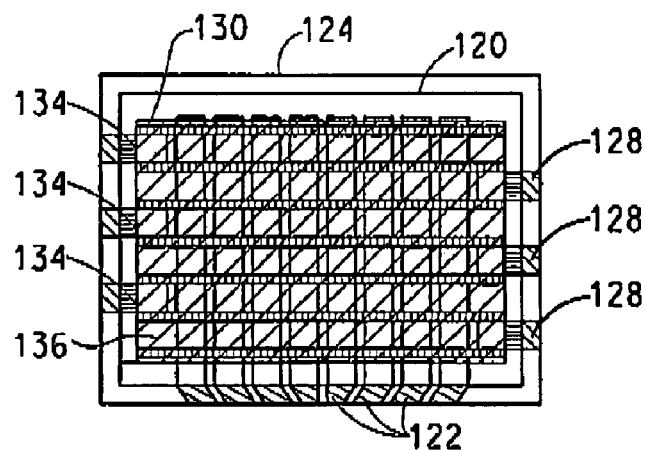
Figure 18:
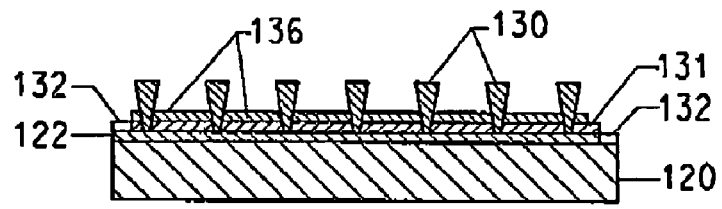

FIG. 10 is a plan view illustrating the formation of second electrodes 136. The second electrodes 136 are formed by depositing a second conductive layer without removing the separators 130. Although the material for the second electrodes 136 is deposited on almost the entire substrate surface, the separators 130 divide the conductive layer into a plurality of bar-shaped second electrodes 136. The second electrodes 136 fill the vias 134 such that each of the second electrodes 136 is electrically coupled to one of the leads 128. This way, the leads 128 can be used to selectively send signals to the appropriate ones of the second electrodes 136. FIG. 18, which is a side view of the substrate 120, shows the second electrodes 136 deposited on top of the charge transport material and organic material 131.

Figure 11:
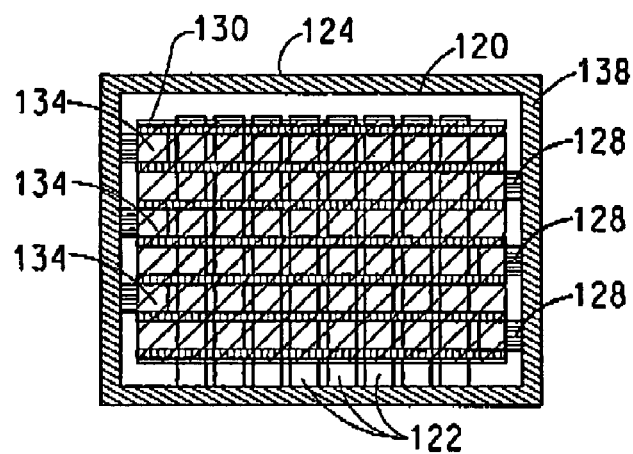

FIG. 11 is a plan view illustrating the deposition of a conductive sealant material 138 in the border 132. The sealant material 138 may be, for example, epoxy mixed with anisotropic gold beads, and may be applied with a syringe and a robotic platform such as the Asmemtic x-y machine. The beads may be self-aligning. The size of the beads vary depending on various factors including the overall device size, the thickness of the sealant, and the desired resistance level but usually ranges about 30 micron in diameter. After the lid 140 (FIG. 12) is placed on the sealant material 138, the epoxy sealant is cured with ultraviolet radiation.

Figure 19:
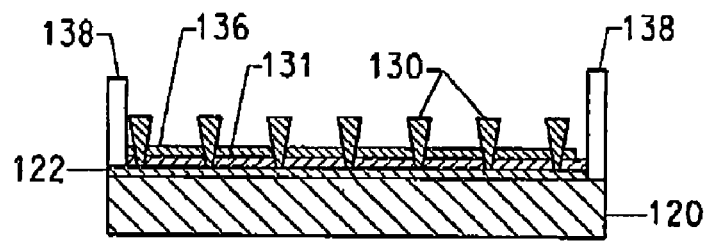

FIG. 19, which is a side view corresponding to FIG. 11, shows the sealant material 138 as being deposited to a thickness greater than that of the spacers 130. Nitrogen may be injected into the space enclosed by the substrate 120, the sealant material 138, and the lid 140.

FIG. 12 is a plan view illustrating a lid 140. The lid 140 is larger than the substrate 120, as further illustrated in FIG. 9. Unlike the conventional lid 40 of FIG. 2, lid 140 does not have a cavity. Instead of a cavity, the lid 140 has a first set of traces 142 and a second set of traces 144 formed thereon. The traces 142, 144 extend to the edges of the lid 140 and may be about 2-3 microns thick. The traces 142, 144 are positioned to be electrically coupled to the first electrodes 122 and the leads 128, respectively, when the lid 140 is coupled with the substrate 120. The traces 142, 144 may be made of copper or aluminum, and may be formed by deposition by spin coating followed by patterning. In some embodiments, the traces 142, 144 may be coated with gold to prevent corrosion.

FIG. 20 shows a side view corresponding to FIG. 12. The thickness of the lid 140 may be about the same as the thickness of the substrate 120.

FIG. 13 is a plan view illustrating getter layer formation on the lid 140. As shown, a getter layer 148 is printed on almost the entire surface of the lid 140 excluding the area near the edges where the seal will be formed. Screen printing or offset printing techniques may be used to print the getter. The getter may come in the form of a paste, such as the zeolite getter supplied by SUD Chemie. By using the paste form of getter, the need for a cavity in the lid is eliminated. The getter also acts as an insulator between the lid traces and the substrate electrodes. FIG. 21 is a side view corresponding to the plan view of FIG. 13. FIG. 21 illustrates that the getter material 148 is deposited to be thicker than the traces 142, 144.

FIG. 14 and FIG. 22 are plan views illustrating the combined substrate 120 and the lid 140. The substrate 120 and the lid 140 are aligned so that the first electrodes 122 are electrically coupled to the first set of traces 142 on the lid 140 via the conductive sealant material 138 and the leads 128 are electrically coupled to the second set of traces 144, also by the conductive sealant material 138. Since the substrate 120 and the lid 140 are different in sizes, portions of the traces 142, 144 on the lid remain uncovered. Signals may be provided to the first electrodes 122 and the second electrodes 136 via the traces 142, 144, thereby activating a selected region of the organic material 131.

The concentration of the beads in the conductive sealant material 138 is adjusted such that the beads touch each other between the substrate 120 and the lid 140 to allow current flow between the first electrodes 122 and the first set of traces 142 and between the second electrodes 136 and the second set of traces 144. However, the beads used for conducting signals from the first set of traces 142 cannot contact the beads used for conducting signals from the second set of traces 144, to maintain the signals as separate.

Although the embodiment here shows the second conductive layer as being electrically coupled to the leads 128 and not to the first electrodes 122, the second conductive layer could be electrically be coupled to any part of the first conductive layer by selective laser ablation.

As mentioned above, moisture adversely affects the performance of the organic electronic device. Thus, it is preferred that the substrate-building process, the lid-building process, and the substrate-lid combination process take place in a moisture-free environment, such as a dry chamber.

While the embodiments above are illustrated in passive matrix organic LED devices, the invention illustrated herein can be adapted for other types of devices, such as an active matrix device. An active matrix device includes a substrate and a transistor, a dielectric layer, and a pixel electrode formed on the substrate. An organic film and a common electrode are deposited on the transparent electrode and the dielectric layer. The layers are covered with a lid and a layer of getter is positioned in the space between the lid and the layers.

The invention may be adapted to the active matrix device by forming traces on the lid and configuring the traces to be coupled to the transistor or the common electrode. A person of ordinary skill in the art will know how to properly route the traces to achieve this end.

In the inventive device and method, the undesirable size increase that usually results from routing the anode and cathode leads to one side is avoided by forming the conductive traces on the encapsulation lid and electrically coupling the traces on the lid to the electrodes with a conductive sealant.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. An organic electronic device comprising:
   a first member including:
      a substrate;
      a first conductive layer overlying the substrate, wherein the first conductive layer extends to one or more edges of the substrate;
      an organic active layer overlying a portion of the first conductive layer; and
      a second conductive layer overlying the organic active layer and the first conductive layer; and a second member coupled to the first member to form an enclosed space, the second member including:
a lid; and
at least one trace electrically coupled to the first conductive layer, the second conductive layer, or both the first and second conductive layers, wherein the at least one trace is the only electronic component within the second member.

2. The organic electronic device of claim 1, wherein the first conductive layer comprises:
first electrodes that overlie a surface of the substrate; and
leads that are electrically isolated from the first electrodes and overlie the substrate.

3. The organic electronic device of claim 2, wherein the leads extend to one or more edges of the substrate.

4. The organic electronic device of claim 2, wherein the at least one trace comprises:
a first set of traces; and
a second set of traces that are electrically isolated from the first set of traces.

5. The organic electronic device of claim 4, wherein the first electrodes are electrically coupled to the first set of traces and the leads are electrically coupled to the second set of traces.

6. The organic electronic device of claim 5, wherein the second conductive layer comprises second electrodes that are electrically coupled to the leads through vias in the organic active layer.

7. The organic electronic device of claim 4, wherein the first set of traces and second set of traces extend to an edge of the lid.

8. An organic electronic device comprising:
a first member including: a substrate, a first conductive layer overlying the substrate, an organic active layer overlying a portion of the first conductive layer within a matrix, and a second conductive layer overlying the organic active layer and on the first conductive layer; and
a second member coupled to the first member, wherein an enclosed space lies between the first member and the second member, the second member including:
a lid;
a getter layer covering most of the matrix of the first member; and
a third conductive layer, wherein the third conductive layer is electrically coupled to one or both of the first and the second conductive layers; and
an electrically conductive sealant material comprising beads of electrically conductive material mixed with epoxy is located between the second member and the first member to electrically coupling the first conductive layer to the third conductive layer.

9. The organic electronic device of claim 8, wherein the electrically conductive sealant couples the lid to the substrate to form an enclosed space.

10. An organic electronic device comprising:
a substrate having a first conductive layer, an organic active layer, and a second conductive layer formed thereon;
a member including a nonconductive lid coupled to the substrate, the lid comprising a third conductive layer overlying a surface of the lid, wherein the second conductive layer is electrically coupled to the first conductive layer and the first conductive layer is electrically coupled to the third conductive layer,
wherein the organic electronic device is configured to emit light from only a single side of the organic electronic device.

11. The organic electronic device of claim 10, wherein the substrate is coupled to the lid with an electrically conductive sealant wherein the sealant electrically couples the first conductive layer to the third conductive layer.

12. The organic electronic device of claim 10, wherein the first conductive layer comprises leads and electrodes that are electrically isolated from each other, and wherein the second conductive layer is electrically coupled to the leads through vias in the organic active layer.

13. A method of making an organic electronic device comprising:
providing a first member with a first conductive layer;
depositing an organic active layer and a second conductive layer over the first conductive layer;
selectively removing the organic active layer to expose portions of the first conductive layer, wherein the exposed portions of the first conductive layer are electrically coupled to the second conductive layer;
depositing a third conductive layer over a lid;
placing a getter layer over a center of the lid, wherein a second member includes the lid, the third conductive layer, and the getter layer; and
coupling the second member to the first member with a conductive sealant such that the first member and the second member enclose the organic active layer and the second conductive layer, and the third conductive layer is electrically coupled to at least the first conductive layer.

14. The method of claim 13 wherein the first conductive layer comprises electrodes and leads, and wherein at least one or more of the electrodes and the leads extend to an edge of the first member.

15. The method of claim 14, wherein the third conductive layer comprises a first set of traces and a second set of traces that are electrically isolated from each other.

16. The method of claim 15, wherein the electrodes in the first conductive layer are electrically coupled to the first set of traces in the third conductive layer.

17. The method of claim 13 further comprising a getter material that is enclosed by the first member and the second member.

18. A method of making an organic electronic device, the method comprising:
providing a substrate;
forming a first conductive layer over the substrate;
depositing an organic active layer over a portion of the first conductive layer;
depositing a second conductive layer over the organic active layer and the first conductive layer;
forming at least one trace over a lid; and
combining the substrate with the lid using a conductive sealant comprising beads of electrically conductive material mixed with epoxy, wherein the conductive sealant electrically couples the at least one trace to the first conductive layer, the second conductive layer, or both the first and the second conductive layers,
wherein the organic electronic device is configured to emit light from only a single side of the organic electronic device.

* * * * *